(12) United States Patent
Devarajan

(10) Patent No.: US 9,793,910 B1
(45) Date of Patent: Oct. 17, 2017

(54) TIME-INTERLEAVED ADCS WITH PROGRAMMABLE PHASES

(71) Applicant: ANALOG DEVICES, INC., Norwood, MA (US)

(72) Inventor: Siddharth Devarajan, Arlington, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/262,325

(22) Filed: Sep. 12, 2016

(51) Int. Cl.
*H03M 1/06* (2006.01)
*H03M 1/12* (2006.01)
*H03M 1/10* (2006.01)

(52) U.S. Cl.
CPC ....... *H03M 1/1215* (2013.01); *H03M 1/0634* (2013.01); *H03M 1/1009* (2013.01); *H03M 1/124* (2013.01)

(58) Field of Classification Search
CPC ............. H03M 1/1215; H03M 1/0634; H03M 1/1009; H03M 1/124
USPC .................................. 341/118–155; 375/346
See application file for complete search history.

(56) References Cited

U.S. PATENT DOCUMENTS

| | | | | |
|---|---|---|---|---|
| 7,675,441 B2 * | 3/2010 | Sheng | ................. | H03M 1/1014 341/120 |
| 2006/0239389 A1 * | 10/2006 | Coumou | ............. | H03M 1/0836 375/346 |
| 2010/0246660 A1 * | 9/2010 | Matsuo | ................. | H03L 7/0807 375/239 |
| 2016/0182075 A1 * | 6/2016 | Devarajan | ........... | H03M 1/1019 341/120 |

FOREIGN PATENT DOCUMENTS

WO 2014/135687 9/2014

OTHER PUBLICATIONS

Bo Xia et al., *A Configurable Time-Interleaved Pipeline ADC for Multi-Standard Wireless Receivers*, 07803-8480-6/04 © 2004, IEEE, 4 pages.
E. Sanchez-Sinencio, *A 10-bit 44-MS/s 20-mW Configurable Time-Interleaved Pipeline ADC for a Dual-Mode 802.11b/Bluetooth Receiver*, IEEE Journal of Solid-State Circuits, Apr. 2006, 11 pages.
Dengquan Li et al., *An 8-Bit, 0.333-2 GS/s Configurable Time-Interleaved SAR ADC in 65-nm CMOS*, Journal of Circuits, Systems and Computers, vol. 24, Issue 06, Jul. 2015, 15 pages.

* cited by examiner

*Primary Examiner* — Lam T Mai
(74) *Attorney, Agent, or Firm* — Patent Capital Group

(57) ABSTRACT

A time-interleaved analog-to-digital converter (ADC) uses M analog-to-digital converters to sample an analog input signal to produce digital outputs. The M ADCs, operating in a time-interleaved fashion, can increase the sampling speed several times compared to the sampling speed of just one ADC. The time-interleaved ADC can be programmed and reconfigured to trade one performance metric for another. For example, more time can be given to comparator to improve bit error rate or more time can be given to an amplifier for improved settling which improves SNR, SFDR etc. If the time-interleaved converters are randomized, then the amount of 'color' in the noise floor shape can also be traded for other performance metrics.

20 Claims, 5 Drawing Sheets

|   | ADC_1 | ADC_2 | ADC_3 | ADC_4 | ADC_5 | ADC_6 | ADC_7 | ADC_8 |
|---|---|---|---|---|---|---|---|---|
| 0 | T | W | W | W | W | W | W | W |
| 1 |   | T | W | W | W | W | W | W |
| 2 |   |   | T | W | W | W | W | W |
| 3 |   |   |   |   | W | W | W | W |
| 4 |   |   |   |   |   | W | W | W |
| 5 |   |   |   |   |   |   | W | W |
| 6 | ? |   |   |   |   |   | ? | ? |
| 7 | - | - |   |   |   |   | - | - |
| 8 | - | - |   |   |   |   | - | - |
| 9 | - | - | - | - |   |   | - | - |

TIME-INTERLEAVED ADCS WITH PROGRAMMABLE PHASES

TECHNICAL FIELD OF THE DISCLOSURE

The present invention relates to the field of integrated circuits, in particular to time-interleaved analog-to-digital converters (ADCs).

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an analog-to-digital converter (ADC) as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing an ADC is a non-trivial task because each application may have different needs in performance, power, cost and size. ADCs are used in a broad range of applications including Communications, Energy, Healthcare, Instrumentation and Measurement, Motor and Power Control, Industrial Automation and Aerospace/Defense. As the applications needing ADCs grow, the need for fast yet accurate conversion also grows.

BRIEF DESCRIPTION OF THE DRAWING

To provide a more complete understanding of the present disclosure and features and advantages thereof, reference is made to the following description, taken in conjunction with the accompanying figures, wherein like reference numerals represent like parts, in which:

FIG. 3 illustrates pseudo-randomization selection of ADCs for a randomized time-interleaved ADC having 8 ADCs, according to some embodiments of the disclosure;

DESCRIPTION OF EXAMPLE EMBODIMENTS OF THE DISCLOSURE

Overview

A time-interleaved analog-to-digital converter (ADC) uses M analog-to-digital converters to sample an analog input signal to produce digital outputs. The M ADCs, operating in a time-interleaved fashion, can increase the sampling speed several times compared to the sampling speed of just one ADC. The time-interleaved ADC can be programmed and reconfigured to trade one performance metric for another. For example, more time can be given to comparator to improve bit error rate or more time can be given to an amplifier for improved settling which improves signal to noise ratio (SNR), spurious-free dynamic range (SFDR), etc. If the time-interleaved converters are randomized, then the amount of "color" in the noise floor shape can also be traded for other performance metrics.

Understanding Time-Interleaved ADCs

Analog-to-digital converters (ADCs) are electronic devices that convert a continuous physical quantity carried by an analog signal to a digital output or number that represents the quantity's amplitude (or to a digital signal carrying that digital number). An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio SINAD, effective number of bits ENOB, signal to noise ratio SNR, total harmonic distortion THD, total harmonic distortion plus noise THD+N, and spurious free dynamic range SFDR. Analog-to-digital converters (ADCs) have many different designs, which can be chosen based on the application requirements and specifications.

Interleaving is a technique used to increase the sample rate of ADCs. Many (low-speed) ADCs can be used in parallel, operating to sample an analog input one after another (in a time-interleaved fashion). Using appropriate clocking to control the ADCs can greatly increase the effective combined ADC sampling rate.

Figure 1:
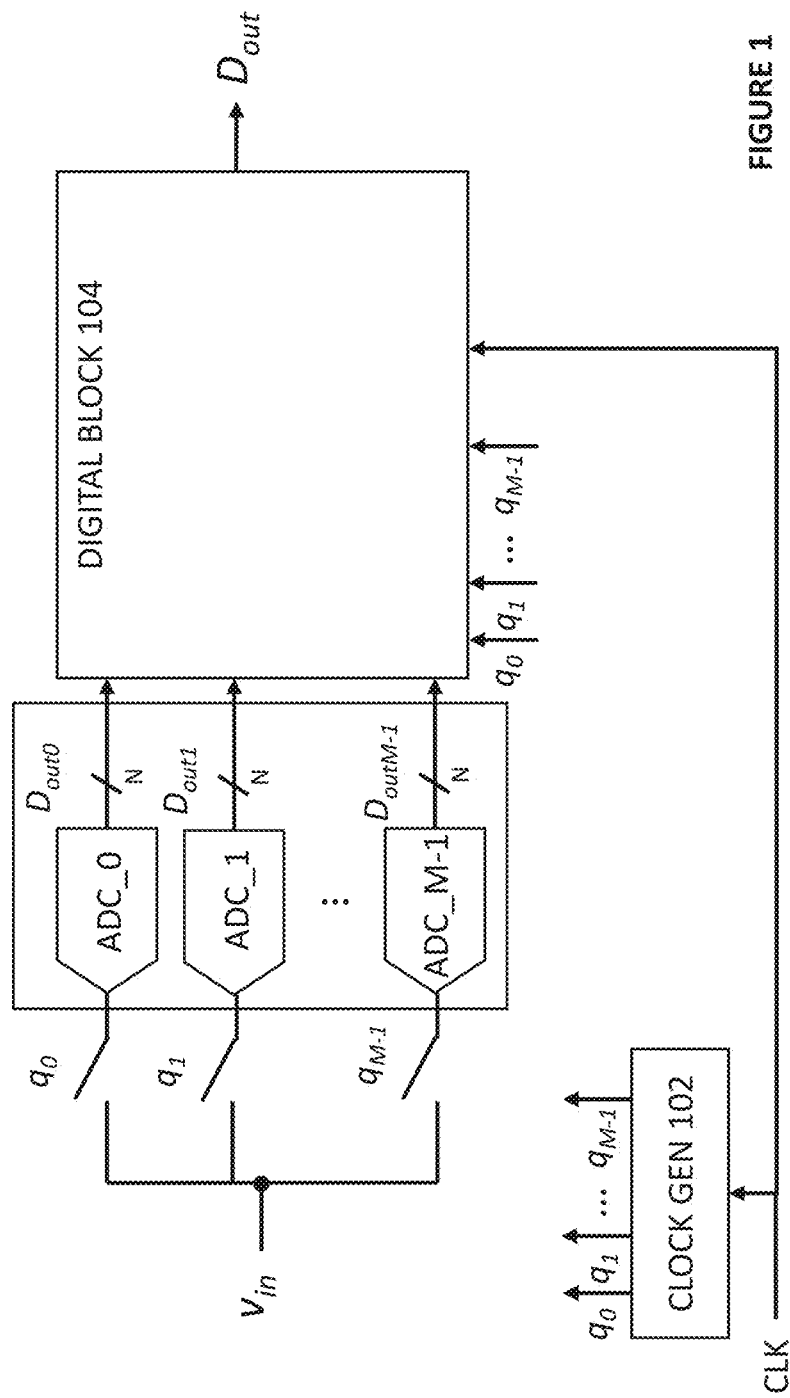
FIG. 1 shows an exemplary time-interleaved ADC having M ADCs.

FIG. 1 shows an exemplary time-interleaved ADC having M ADCs, ADC_0 to ADC_M−1. Together, with appropriate clocking, the M sub-ADCs can provide a very high sampling rate. The appropriate clocking can be provided by clock generator 102 to produce clock signals or selection signals, $q_0, q_1, \ldots q_{M-1}$, having different phases, to select one of the M ADCs for sampling the analog input signal for a given cycle and converting the analog input signal to a digital output. Phrased differently, the clock generator 102 produces selection signals triggering the analog-to-digital converters in the time-interleaved analog-to-digital converter to sample the analog input signal in a sequential and time-interleaved manner. M can be greater than or equal to two. The M ADCs sample the input signal $v_{in}$ one after another and produce corresponding digital outputs, $D_{out0}, D_{out1}, \ldots D_{outM-1}$, respectively, which are then combined by the digital block 104 to produce the digital output $D_{out0}$. In one example, the M ADCs can operate in a round-robin fashion or sequential fashion, where the M ADCs samples the input in a fixed sequence or sequential manner.

The type of sequential interleaving described above suffers from the property that any mismatches between the M ADCs and even errors after error calibration would show up in the ADC output frequency spectrum (e.g., a spectrum generated by a Fast Fourier Transform) as spurs in discrete frequency bins with large concentrated energy content. These spurs can be undesirable for many applications, and can significantly affect the dynamic performance of the time-interleaved ADC. To address this issue, time-interleaved ADCs can operate in a pseudo-randomized fashion, so that the mismatch errors would be "averaged out". As a result, the spurs mentioned previously can be "spread over the noise floor". To implement pseudo-randomized time-interleaved sampling, one of the idle or ready-to-sample ADCs (generally one or more other ADCs would be busy sampling and/or performing a conversion of the analog input) can be randomly selected by the clock generator 102 as the ADC being used for sampling the analog input signal for a given cycle and converting the analog input signal to a digital output. Phrased differently, the clock generator 102 can generate selection signals for triggering sampling by the analog-to-digital converters in a time-interleaved and pseudo-randomized manner.

When a given ADC is selected, it cannot be selected immediately after for a certain (fixed) number of cycles, since generally it would take more than one cycle to perform at least a part of the conversion before the given ADC is free to sample the analog input signal again. Of the remaining ADC choices (ready-to-sample again, or idle ADCs), one is chosen randomly. Such selection implements pseudo-randomization. ADC selection sequence or the sequence in which the ADCs sample the analog input and produce digital outputs can be randomized, or at least pseudo-randomized. Randomized time-interleaved ADCs can have three or more ADCs (i.e., M is greater than or equal to three). Based on the sequence, the clock generator 102 generates appropriate clocking/selection signals, $q_0, q_1, \ldots q_{M-1}$, to cause the M ADCs to sample the analog signal $v_{in}$ in a pseudo-randomized sequence and produce digital outputs $D_{out1}, D_{out2}, D_{out3}$ according to the pseudo-randomized sequence. The selection signals or sequence information can be provided to the digital block 104 to ensure the data can combine the digital outputs $D_{out1}, D_{out2}, D_{out3}$ in accordance with the pseudo-randomized sequence.

Pseudo-randomization helps spread the discrete mismatch error tones in the spectrum of the ADC output $D_{out}$. The discrete tones (spurs) would have been present if the selection was sequential, e.g., where the M ADCs are used according to a fixed sequence. Through pseudo-randomization, the discrete tones are spread into the noise floor. Due to the pseudo-random nature of the selection, the noise floor is not "white", but slightly "colored" with lumps in certain ranges of frequencies.

Different Phases of Conversion for an ADC in a Time-Interleaved ADC

Typically, a time-interleaved ADC has a plurality of ADCs (sometimes referred to as sub-ADCs), wherein sampling instants of the plurality of ADCs are interleaved in time. The sub-ADC in the time-interleaved ADC would sample an analog input signal one after another. For purposes of illustration, a sub-ADC is a multi-stage/multi-step ADC, such as a pipeline ADC, or multi-stage noise shaping ADC, but other types of ADCs are envisioned by the disclosure, including other types of multi-stage/multi-step ADCs, signal modulators, and single-stage ADCs.

Each sub-ADC performs conversion of the analog input signal in a plurality of phases. For a multi-stage/multi-step sub-ADC, the sub-ADC can have a front end (first stage in a multi-stage ADC) for sampling the analog input signal and performing conversion in a plurality of phases. During the execution of the phases, a sub-ADC is considered busy, and cannot be selected to sample the analog input signal again until the phases are complete. After the phases are complete, the sub-ADC can be ready-to-sample again. In an example, the front end can output an amplified residue for a subsequent stage for further processing upon completion of the phases and becomes ready to sample the analog input signal again.

Figure 2:
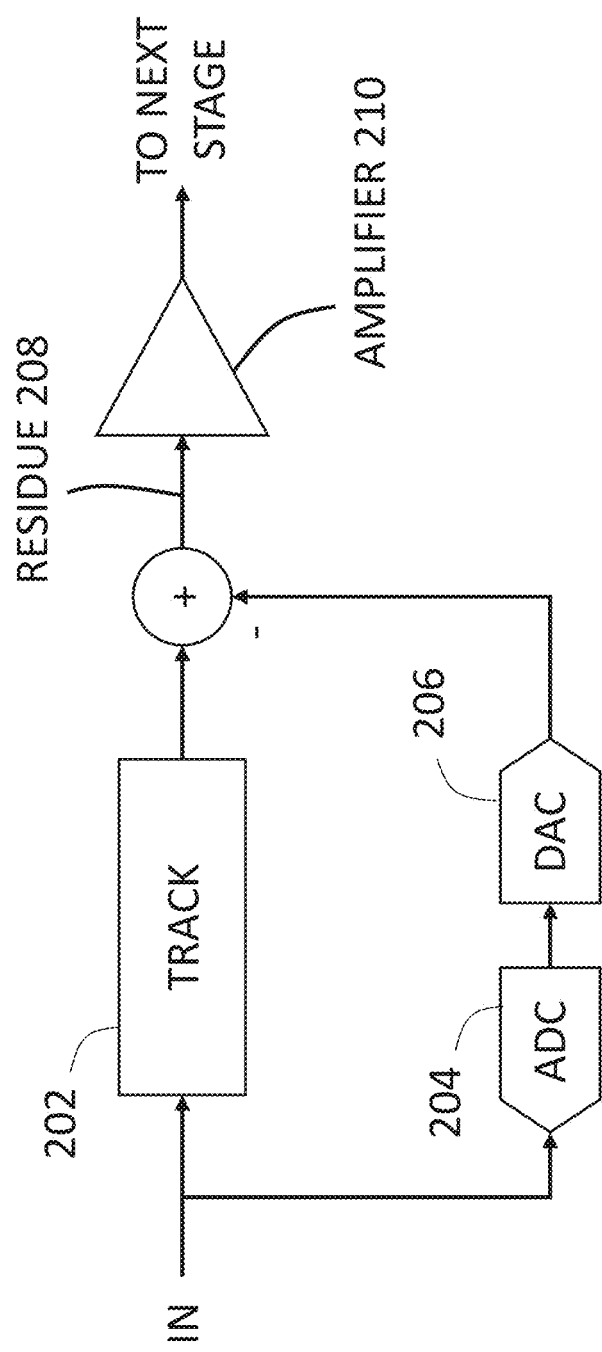
FIG. 2 shows an exemplary front end in a multi-stage ADC, according to some embodiments of the disclosure.

When one of the M ADCs in the time-interleaved ADC is busy, it can be in one of the plurality of phases of conversion (e.g., steps of conversion). FIG. 2 shows an exemplary front end in a multi-stage ADC to illustrate the exemplary phases of conversion, according to some embodiments of the disclosure. This front end generates an amplified residue for the next/subsequent stage in the multi-stage/multi-step ADC. In a first phase, "track phase", the front end has circuitry 202 for sampling or tracking the analog input signal. In a second phase, "flash phase", a coarse ADC 204 samples and holds the analog input signal. During this "flash phase" the coarse ADC 204 quantizes the analog input signal or converts the analog input signal into the digital signal, e.g., using a plurality of comparators to determine and generate a digital signal which represents the analog input signal. In a third phase, "reconstruct phase", a digital-to-analog converter (DAC) 206 reconstructs the analog input signal by generating an analog output based on the digital signal from the coarse ADC 204. The second phase and/or the third phase may overlap in time with the first phase. In a fourth phase, "residue phase", the residue 208 is generated by finding a difference between the sampled analog input signal and the reconstructed analog input signal. The residue can be amplified by an amplifier 210 to generate the amplified residue for further processing by the next stage. In a fifth phase, "reset phase", circuitry in the front end (circuitry in the sub-ADC converting the analog input signal) resets, e.g., capacitors are reset to clear signals which may otherwise be left over in the circuitry. These exemplary phases are for illustration only, and other phases of conversion are can be defined for sampling and performing conversion of an analog input signal. After the phases are complete, the front end is ready to sample the analog input signal again.

Each phase, when it is to be executed, can have a non-zero duration, since circuits inherently require time to process and/or generate signals. At the minimum, these phases keep a sub-ADC busy for one or more cycles for the time-interleaved ADC. Each phase can have a duration of one or more (clock) cycles and the durations for the phases are fixed; having to execute several phases of conversion would then make the sub-ADC busy for a plurality of cycles. For a randomized interleaved ADC, the number of cycles a sub-ADC is busy affects the number of sub-ADC(s) which are available for random selection as the next sub-ADC to sample the analog input sample.

FIG. 3 illustrates pseudo-randomization selection of ADCs for a randomized time-interleaved ADC having 8 ADCs, according to some embodiments of the disclosure. In this example, the time-interleaved ADC has 8 (sub-)ADCs. Suppose ADC_1, ADC_2, ADC_3, ADC_4, ADC_5, and ADC_6 are (randomly) selected to sample the analog input signal one after another, and each sub-ADC is busy for a total of 6 cycles each time (or busy for the next 5 cycles) when it is selected to sample the analog input signal to execute the phases described above. This would mean that three sub-ADCs are up for randomized selection in a given cycle to sample the analog input signal again. In other words, one out of three sub-ADCs would be randomly chosen to sample the analog input signal again. In a different example, suppose there are the same number sub-ADCs, but each time-interleaved ADC is busy for a total of 7 cycles each time (or busy for the next 6 cycles) when it is selected to sample the analog input signal to execute the phases described above. This would mean that two sub-ADCs are up for randomized selection in a given cycle to sample the analog input signal again. In other words, one out of two sub-ADCs would be randomly chosen to sample the analog input signal again.

As previously explained, the randomization helps to average out the mismatches between the sub-ADCs. However, the amount of randomization available for a given system can affect the amount of averaging of the mismatches the randomization can do in improving the output spectrum (i.e., how much the spurs can be spread across the noise floor). When more randomization is available (i.e., when more sub-ADCs are available for random selection), the noise floor is less lumpy, less "colored", or more white. Therefore, the noise floor can be less "colored". While it is possible to implement a time-interleaved ADC to include more sub-ADCs in silicon, increasing the number of sub-ADCs is not always a practical option. When given a fixed number of sub-ADCs, it may be beneficial to find another scheme to adjust the amount of randomization available for the time-interleaved ADC.

Time-Interleaved ADC with Adjustable Phases

When the number of cycles that a sub-ADC is busy completing phases of conversion can be adjusted, it is possible to increase or decrease the amount of randomization that a randomized time-interleaved ADC can leverage to average out the mismatches which is causing the "coloring" in the noise floor in the output spectrum. If the number of cycles (or total duration) is adjusted, it is possible that one or more performance metrics for the sub-ADC is affected. The programmability of the phases thus allows a user to trade the one or more performance metrics for the amount of "coloring" in the output spectrum.

For both randomized and sequential time-interleaved ADCs, the programmability of the phases can even allow trading of the performance metrics within the sub-ADC by increasing the duration of one phase and decreasing the duration of one phase while keeping the total number of cycles the same. Furthermore, the programmability of the phases can allow trading of the performance metrics for power consumption by increasing or decreasing the number of cycles a sub-ADC is busy, allows for more sub-ADCs to be idle or turned off at a given time.

Figure 4:
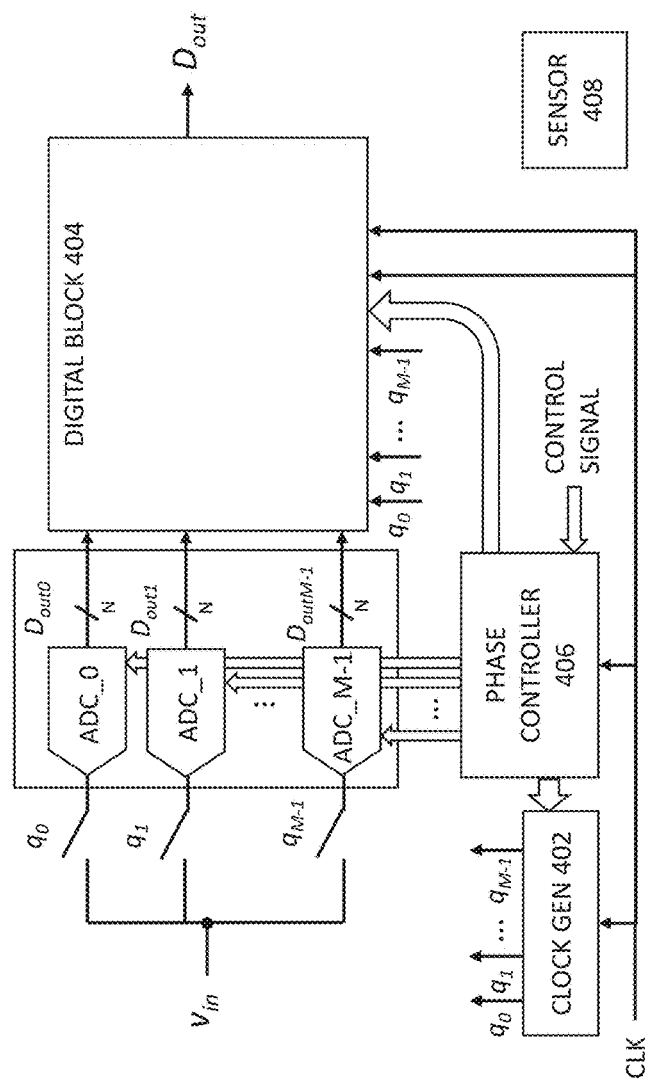
FIG. 4 shows an exemplary time-interleaved ADC having M ADCs having programmable phases, according to some embodiments of the disclosure.

FIG. 4 shows an exemplary time-interleaved ADC having M ADCs having programmable phases, according to some embodiments of the disclosure. Programmable phases within the context of this disclosure means that the duration of a phase (a number of cycle(s) that the phase is allowed to take) can be increased or decreased, and in some cases, a phase can be eliminated completely (where the duration of the phase is decreased to zero). The programmable time-interleaved analog-to-digital converter shown in FIG. 4 includes a plurality of analog-to-digital converters ADC_0, ADC_1, . . . . ADC_M−1. The sampling instants of the analog-to-digital converters are interleaved in time and each analog-to-digital converter performs conversion of an analog input signal in a plurality of phases. These phases keep a particular ADC busy for a number of cycles. Exemplary phases can include phases described herein, such as a "track phase", "flash phase", "reconstruct phase", "residue phase", "reset phase", etc. Depending on the particular sub-ADC architecture, the phases can be different from the examples mentioned. At least one clock cycle can be allotted for a given phase.

The programmable time-interleaved analog-to-digital converter can include a clock generator 402 for triggering sampling by the analog-to-digital converters in a time-interleaved manner, via appropriate selection signals $q_0$, $q_1$, . . . $q_{M-1}$. In some embodiments where randomized time-interleaving is desired, the clock generator 402 can trigger sampling by the analog-to-digital converters in a time-interleaved and pseudo-randomized manner, via selection signals $q_0$, $q_1$, . . . $q_{M-1}$. The programmable time-interleaved analog-to-digital converter can further include a digital block 404 for combining digital outputs, $D_{out0}$, $D_{out1}$, . . . $D_{outM-1}$, to produce the digital output $D_{out}$.

Further to the clock generator 402, the time-interleaved ADC can include a phase controller 406 to adjust duration of one or more phases being executed by the sub-ADCs when a given sub-ADC is selected to sample the analog input signal. The phase controller 406 can receive a signal indicating how to adjust the one or more phases. The phase controller 406 can generate appropriate control signals to the sub-ADCs to implement the indicated adjustment. The control signals can control circuitry which implements how many cycle(s) are allotted or provided for executing a particular phase. The control signals can affect the timing of the circuitry in the sub-ADC.

If needed, the phase controller 406 can generate one or more signals to clock generator 402 to modify the selection pattern or sequence if the adjustment of one or more phases would affect the selection pattern or sequence. For instance, if the adjustment of phases reduces or increase the number of sub-ADCs available for random selection, the clock generator 404 may be adjusted accordingly. Furthermore, the phase controller 406 can generate one or more signals to digital block 406 to modify timing of combining digital outputs if the adjustment of one or more phases would affect the timing in the digital block 404. For instance, if the adjustment of phases changes when a digital output is ready, the digital block 404 may be adjusted accordingly.

One or more factors or conditions may trigger a control signal to be provided to phase controller 406 to adjust duration of one or more phases.

As previously explained, the adjustment of the duration of one or more phases can allow the tradeoff of one performance metric with another performance metric. In one example, a user may decide to implement a specific tradeoff between some performance metrics. In another example, just before use, a chip manufacturer may decide to tune/tweak the performance metrics for a particular target application without having to change the silicon. In these examples, the phase controller 406 can adjust duration of one or more phases based on an input signal specifying a mode of operation (e.g., the input signal as the control signal being provided to the phase controller), or a programmable value specifying a mode of operation (e.g., the programmable value being programmable using an input signal).

In some cases, the adjustment of the duration of one or more phases is triggered based on one or more operating conditions. If the temperature is high, and it is desirable to tradeoff one performance metric for another to compensate for high temperature, the control signal to the phase controller 406 can reflect such tradeoff and cause the phase controller 406 to change the duration of one or more phases. For instance, the phase controller adjusts duration of one or more phases based on a signal from a sensor (e.g., sensor on chip, sensor off-chip, sensor 408). Sensor can be a temperature sensor, gyroscope, light sensor, humidity sensor, pressure sensor, etc.

In some cases, the adjustment of the duration of one or more phases is triggered based on a characteristic of the analog input signal. Performance of the sub-ADC can often change based on characteristics such as frequency, amplitude, or amount of noise in the analog-input signal. If a characteristic of the analog input signal can negatively affect a particular performance metric, it may be desirable to compensate for the loss in that performance metric (or to make up for the loss by increasing another performance metric) by adjusting duration of one or more phases. The control signal to the phase controller 406 can reflect such tradeoff and cause the phase controller 406 to change the duration of one or more phases. To sense a characteristic of the analog input signal, circuitry (e.g., a sensing ADC) can be included to directly sense the analog input signal, or indirectly sense the analog input signal by processing any one or more of the following: digital signals in the sub-ADCs and digital output signals $D_{out0}$, $D_{out1}$, ... $D_{outM-1}$, and $D_{out}$. The phase controller 406 adjusts duration of one or more phases based on a characteristic of the analog input signal (e.g., a mode of operation having the desired tradeoff can be reflected in the control signal being provided to phase controller 406).

Methods for Programming the Time-Interleaved ADC and Potential Tradeoffs

Figure 5:
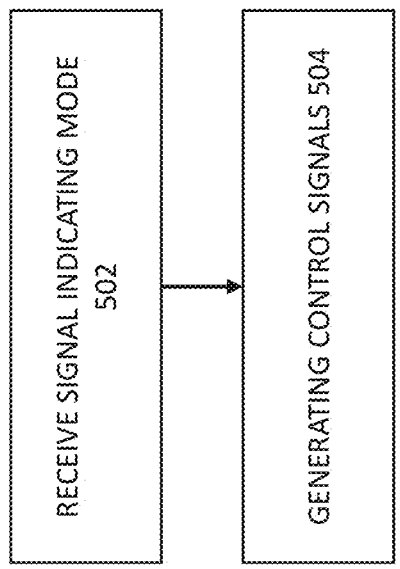
FIG. 5 is a flow diagram illustrating a method for programming phases of a time-interleaved ADC, according to some embodiments of the disclosure.

FIG. 5 is a flow diagram illustrating a method for programming phases of a time-interleaved ADC, according to some embodiments of the disclosure. The method can be applicable to sequential time-interleaved ADCs, where a clock generator triggers the analog-to-digital converters in the time-interleaved analog-to-digital converter to sample the analog input signal in a sequential manner. The method can also be applicable to randomized time-interleaved ADCs, where a clock generator randomly selecting one of idle or ready-to-sample analog-to-digital converters to sample the analog input signal.

In task 502, a signal indicating a mode of operation for the time-interleaved analog-to-digital converter is received. The mode of operation can reflect a desired tradeoff for one performance metric for another performance metric. In task 504, control signals to a plurality of analog-to-digital converters ("sub-ADCs") of the time-interleaved analog-to-digital converter are generated according to the mode of operation, wherein the control signals controls how long a given analog-to-digital converter in the time-interleaved analog-to-digital converter is busy when the given analog-to-digital converter has been selected to sample an analog input signal. Phrased differently, the control signals controls duration of one or more phases of conversion of the analog input signal performed by the given analog-to-digital converter. Varying the control signals varies a number of cycles a given analog-to-digital converter utilizes to perform a particular phase of conversion.

In some embodiment, the control signals varies the number of cycles allotted to a phase where a coarse analog-to-digital converter of the given analog-to-digital converter is converting the analog input signal into a digital signal. The number of cycles allotted can be increased or decreased depending on the tradeoff desired.

As previously noted, a sub-ADC may include such a phase (referred herein as the "flash phase"), where one or more cycles may be allotted to allow flash comparators to make a decision and generate a digital signal representing the analog input signal. Increasing the number of cycles allotted for the "flash phase" can decrease a bit error rate since more time is provided for the comparators to settle and make a decision. Decreasing the number of cycles allotted for the "flash phase" can increase bit error rate. Different tradeoffs can be made for the increase in bit error rate.

Suppose the number of cycles allotted for the "flash phase" is decreased by X number of cycles (e.g., X can be equal to 1, 2, 3, . . . , etc.). The X number of cycles can be given to another phase to increase the number of cycles allotted to that other phase. For instance, the number of cycles allotted to "residue phase" can be increased. In another instance, the number of cycles allotted to "reset phase" can be increased. In these instances, another performance metric such as SNR and SFR can be improved (while the bit error rate may be degraded). The reduction by X number of cycle(s) for a given phase can also mean that the total number of cycles that a sub-ADC is busy can be reduced, which means that more sub-ADCs are available for randomized selection. As a result, the amount of "coloring" of the noise floor can be improved (achieving a "whiter noise floor) while bit error rate is increased. Accordingly, varying the control signals can adjust a bit error rate of the given analog-to-digital converter in exchange for amount of noise coloring at an output of the time-interleaved analog-to-digital converter. The reduction by X number of cycles can also mean that more circuitry can be turned off or run in a low power state. The amount of power consumption can be lowered while bit error rate is increased. Accordingly, varying the control signals can adjust a bit error rate of the given analog-to-digital converter in exchange for power consumed by the time-interleaved analog-to-digital converter. It is understood by one skilled in the art that the opposite effect can be achieved if the number of cycles allotted for the "flash phase" is increased. This programmability for the "flash phase" allows the time-interleaved ADC to be tuned for a particular target application where bit error rate may not be as important (e.g., communications) or may be more important (e.g., instrumentation) than other performance metrics, by adjusting the number of cycles allotted for the "flash phase".

In some embodiment, the control signals are varied to control whether a particular phase of conversion is to be performed by a given analog-to-digital converter. One can remove the one of the phases and no longer executes said one of the phases (e.g., turn off a phase). Or one can add an additional phase which was not previously being executed (e.g., turn on a phase).

Suppose the control signals are varied to turn off "reset phase" all together in a particular mode of operation. As previously noted, a sub-ADC may include such a "reset phase", where one or more cycles may be allotted to allow circuitry to fully reset and clear signal content in the circuit before sampling the analog input signal again (e.g., phase where circuitry in the given analog-to-digital converter converting the analog input signal resets). Removing the "reset phase" can increase the amount of distortion at the output since some left over signal may spew back to the input if the reset phase is skipped (or shortened). Different tradeoffs can be made for the increase in distortions.

Suppose removing the "reset phase" frees up Y number of cycles (e.g., Y can be equal to 1, 2, 3, . . . , etc.). The Y number of cycles can be given to another phase to increase the number of cycles allotted to that other phase. For instance, the number of cycles allotted to "residue phase" can be increased. In another instance, the number of cycles allotted to "flash phase" can be increased. In these instances, another performance metric such as bit error rate, SNR, and/or SFR can be improved (while the amount of distortions may be increased). The reduction by Y number of cycle(s) can also mean that the total number of cycles that a sub-ADC is busy can be reduced, which means that more sub-ADCs are available for randomized selection. As a result, the amount of "coloring" of the noise floor can be improved (achieving a "whiter" noise floor) while the amount of distortions is increased. Accordingly, varying the control signals to adjust an amount of distortion of a given analog-to-digital converters in exchange for amount of noise coloring at an output of the time-interleaved analog-to-digital converter. The reduction by Y number of cycles can also mean that more circuitry can be turned off or run in a low power state. The amount of power consumption can be lowered while the amount of distortions is increased. Accordingly, varying the control signals can adjust an amount of distortion at an output of the given analog-to-digital converter in exchange for power consumed by the time-interleaved analog-to-digital converter. It is understood by one skilled in the art that the opposite effect can be achieved if the "reset phase" is added or the number of cycles allotted for the "reset phase" is increased. This programmability for the "reset phase" allows the time-interleaved ADC to be tuned for a particular target application where output distortions may not be as important or may be more important than other performance metrics, by adjusting the number of cycles allotted for the "reset phase", including removing the "reset" phase completely.

Figure 6:
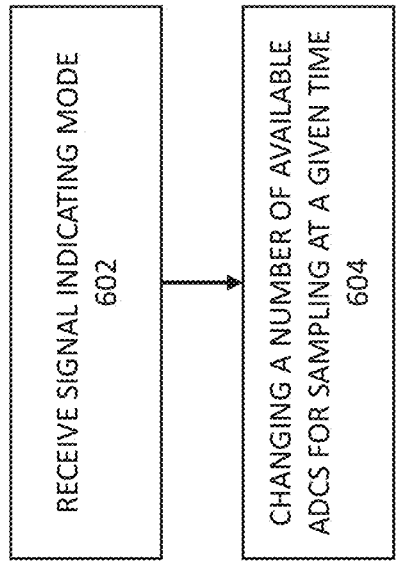
FIG. 6 is a flow diagram illustrating a method for programming phases of a time-interleaved ADC, according to some embodiments of the disclosure.

Method for Configuring a Time-Interleaved Analog-to-Digital Converter to Increase or Decrease the Number of Available Sub-ADCs for Selection FIG. 6 is a flow diagram illustrating a method for programming phases of a time-interleaved ADC, according to some embodiments of the disclosure. In task 602, circuitry receives a signal indicating a mode of operation for the time-interleaved analog-to-digital converter comprising at least three plurality of analog-to-digital converters (sub-ADCs). In task 604, the circuitry changes, based on the mode of operation, a number of analog-to-digital converters that is available for selection to sample an analog input signal for a given time while one or more other analog-to-digital converters are performing conversion of the analog input signal. As previously mentioned, said adjustment can affect the amount of randomization (i.e., the amount of "coloring" in the noise floor of the output spectrum), and the amount of power consumed by the time-interleaved ADC.

In some embodiments, changing the number of analog-to-digital converters that is available for selection can include changing a number of cycles allotted for a given conversion phase performed by a given analog-to-digital converter. In some embodiments, changing the number of analog-to-digital converters that is available for selection can include implementing or skipping a phase in a plurality of phases being performed a given analog-to-digital converter to convert the analog input signal.

Variations and Implementations

It is envisioned by the disclosure that a duration for any one of the phases described herein or other suitable phases not mentioned herein can be adjusted to achieve the tradeoff in one performance metric with another performance metric. Note that the tradeoffs do not relate to adjusting sampling rates, or resolution. Rather, the tradeoffs relate to dynamic performance metrics of a time-interleaved ADC.

The present disclosure encompasses apparatuses which can perform the various methods described herein, including methods illustrated by FIGS. 5 and 6. Such apparatuses can include the phase controller in FIG. 4, as well as circuitry in the sub-ADCs controllable by control signals generated by the phase controller (e.g., circuitry which can affect the timing in the sub-ADCs for carrying out the phases of conversion). Parts of various apparatuses for configuring phases a time-interleaved ADC can include electronic circuitry to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

Note that the activities discussed above with reference to the FIGURES are applicable to any integrated circuits that involve processing analog signals and converting the analog signals into digital data using a plurality of ADCs. In certain contexts, the features discussed herein related to a high-speed ADC, i.e., the time-interleaved ADC, can be applicable to medical systems, scientific instrumentation, wireless and wired communications systems (especially systems requiring a high sampling rate), radar, industrial process control, audio and video equipment, instrumentation, and other systems which uses ADCs. The level of performance offered by time-interleaved ADCs can be particularly beneficial to products and systems in demanding markets such as high speed communications, medical imaging, synthetic aperture radar, digital beam-forming communication systems, broadband communication systems, high performance imaging, and advanced test/measurement systems (oscilloscopes).

In the discussions of the embodiments above, the parts and components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of components of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the components of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the error calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions configuring a time-interleaved ADC, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A programmable time-interleaved analog-to-digital converter comprising:
   a plurality of analog-to-digital converters, wherein sampling instants of the analog-to-digital converters are interleaved in time and each analog-to-digital converter performs conversion of an analog input signal in a plurality of phases; and
   a phase controller to adjust a number of cycles allotted for one or more phases.

2. The programmable time-interleaved analog-to-digital converter of claim 1, further comprising:
   a clock generator for triggering sampling by the analog-to-digital converters in a time-interleaved manner.

3. The programmable time-interleaved analog-to-digital converter of claim 1, further comprising:
   a clock generator for triggering sampling by the analog-to-digital converters in a time-interleaved and pseudo-randomized manner.

4. The programmable time-interleaved analog-to-digital converter of claim 1, wherein the phase controller adjusts the number of cycles based on an input signal specifying a mode of operation.

5. The programmable time-interleaved analog-to-digital converter of claim 1, wherein the phase controller adjusts the number of cycles based on a signal from a sensor.

6. The programmable time-interleaved analog-to-digital converter of claim 1, wherein the phase controller adjusts the number of cycles based on a characteristic of the analog input signal.

7. A method for configuring a time-interleaved analog-to-digital converter, the method comprising:
   receiving a signal indicating a mode of operation for the time-interleaved analog-to-digital converter; and
   generating control signals to a plurality of analog-to-digital converters of the time-interleaved analog-to-digital converter according to the mode of operation, wherein the control signals control how long a given analog-to-digital converter in the time-interleaved analog-to-digital converter is busy when the given analog-to-digital converter has been selected to sample an analog input signal.

8. The method of claim 7, wherein control signals control a duration of one or more phases of conversion of the analog input signal performed by the given analog-to-digital converter.

9. The method of claim 7, further comprising:
varying the control signals varies a number of cycles a given analog-to-digital converter utilizes to perform a particular phase of conversion.

10. The method of claim 9, wherein the particular phase of conversion comprises a phase where a coarse analog-to-digital converter of the given analog-to-digital converter is converting the analog input signal into a digital signal.

11. The method of claim 7, further comprising:
varying the control signals to adjust a bit error rate of the given analog-to-digital converter in exchange for amount of noise coloring at an output of the time-interleaved analog-to-digital converter.

12. The method of claim 7, further comprising:
varying the control signals to control whether a particular phase of conversion is to be performed by a given analog-to-digital converter.

13. The method of claim 12, wherein the particular phase of conversion is a phase where circuitry in the given analog-to-digital converter converting the analog input signal resets.

14. The method of claim 7, further comprising:
varying the control signals to adjust an amount of distortion of a given analog-to-digital converters in exchange for amount of noise coloring at an output of the time-interleaved analog-to-digital converter.

15. The method of claim 7, further comprising:
varying the control signals in exchange for power consumed by the time-interleaved analog-to-digital converter.

16. The method of claim 7, further comprising:
triggering the analog-to-digital converters in the time-interleaved analog-to-digital converter to sample the analog input signal in a sequential manner.

17. The method of claim 16, further comprising:
randomly selecting one of idle or ready-to-sample analog-to-digital converters to sample the analog input signal.

18. An apparatus for configuring a time-interleaved analog-to-digital converter, the apparatus comprising:
means for receiving a signal indicating a mode of operation for the time-interleaved analog-to-digital converter comprising at least three plurality of analog-to-digital converters; and
means for changing, based on the mode of operation, a number of analog-to-digital converters that is available for selection to sample an analog input signal for a given time while one or more other analog-to-digital converters are performing conversion of the analog input signal.

19. The apparatus of claim 18, wherein the means for changing the number of analog-to-digital converters that is available for selection comprises:
means for changing a number of cycles allotted for a given conversion phase performed by a given analog-to-digital converter.

20. The apparatus of claim 18, wherein the means for changing the number of analog-to-digital converters that is available for selection comprises:
means for implementing or skipping a phase in a plurality of phases being performed a given analog-to-digital converter to convert the analog input signal.

* * * * *